(12) United States Patent
Ichikawa et al.

(10) Patent No.: US 10,941,339 B2
(45) Date of Patent: Mar. 9, 2021

(54) FLUORESCENT FLUORIDE, LIGHT-EMITTING DEVICE, AND PROCESS FOR PRODUCING FLORESCENT FLUORIDE

(71) Applicant: Denka Company Limited, Chuo-ku, Tokyo (JP)

(72) Inventors: Masayoshi Ichikawa, Omuta (JP); Hideyuki Emoto, Omuta (JP); Ryosuke Kondo, Omuta (JP)

(73) Assignee: Denka Company Limited, Tokyo (JP)

( * ) Notice: Subject to any disclaimer, the term of this patent is extended or adjusted under 35 U.S.C. 154(b) by 400 days.

(21) Appl. No.: 15/764,285

(22) PCT Filed: Sep. 30, 2016

(86) PCT No.: PCT/JP2016/079005
§ 371 (c)(1),
(2) Date: Mar. 28, 2018

(87) PCT Pub. No.: WO2017/057671
PCT Pub. Date: Apr. 6, 2017

(65) Prior Publication Data
US 2018/0282620 A1    Oct. 4, 2018

(30) Foreign Application Priority Data

Sep. 30, 2015  (JP) ................................. 2015-193323
Mar. 30, 2016  (JP) ................................. 2016-067105

(51) Int. Cl.
*C09K 11/61*    (2006.01)
*C09K 11/77*    (2006.01)
*H01L 33/50*    (2010.01)

(52) U.S. Cl.
CPC ........ *C09K 11/616* (2013.01); *C09K 11/7734* (2013.01); *H01L 33/504* (2013.01); *H01L 33/502* (2013.01); *H01L 2933/0041* (2013.01)

(58) Field of Classification Search
CPC . C09K 11/616; C09K 11/7734; H01L 33/502; H01L 33/504
See application file for complete search history.

(56) References Cited

U.S. PATENT DOCUMENTS

| | | | |
|---|---|---|---|
| 9,871,172 B2 * | 1/2018 | Kim | .................... H01L 33/0095 |
| 2006/0169986 A1 | 8/2006 | Radkov et al. | |
| 2010/0091215 A1 | 4/2010 | Fukunaga et al. | |
| 2010/0142189 A1 | 6/2010 | Hong et al. | |
| 2012/0256125 A1 * | 10/2012 | Kaneyoshi | ........... C01G 25/006 252/301.4 F |
| 2015/0162506 A1 | 6/2015 | Lee et al. | |

FOREIGN PATENT DOCUMENTS

| | | | |
|---|---|---|---|
| CN | 104789214 | | 7/2015 |
| CN | 105331360 | * | 2/2016 |
| JP | 2015140424 | | 8/2015 |
| JP | 2015140425 | | 8/2015 |
| WO | WO 2009119486 | | 10/2009 |
| WO | WO 2015093430 | | 6/2015 |

OTHER PUBLICATIONS

Translation for CN 105331360, Feb. 17, 2016.*

* cited by examiner

*Primary Examiner* — C Melissa Koslow
(74) *Attorney, Agent, or Firm* — Rudy J. Ng; Bozicevic, Field & Francis LLP

(57) ABSTRACT

The purpose of the present invention is to provide a fluoride phosphor (represented by the general formula $A_2SiF_6:Mn$) having high luminescence intensity and reliability, a high-luminance light-emitting device using this phosphor, and a production method for this phosphor.
The production method for a fluoride phosphor represented by the general formula $A_2SiF_6:Mn$ (where element A is an alkali metal element including at least potassium), wherein the fluoride phosphor production method comprises: a step of preparing an aqueous solution wherein element A and fluorine are dissolved in a solvent; and a step of adding, to the aqueous solution, solid silicon dioxide and a manganese compound that supplies manganese having a valence other than +7; wherein an added amount of the manganese compound is within a range such that an Mn content in the fluoride phosphor becomes at least 0.1 mass % and at most 1.5 mass %; and the fluoride phosphor precipitates as the silicon dioxide concurrently dissolves into the aqueous solution.

18 Claims, 3 Drawing Sheets

[Fig. 1]
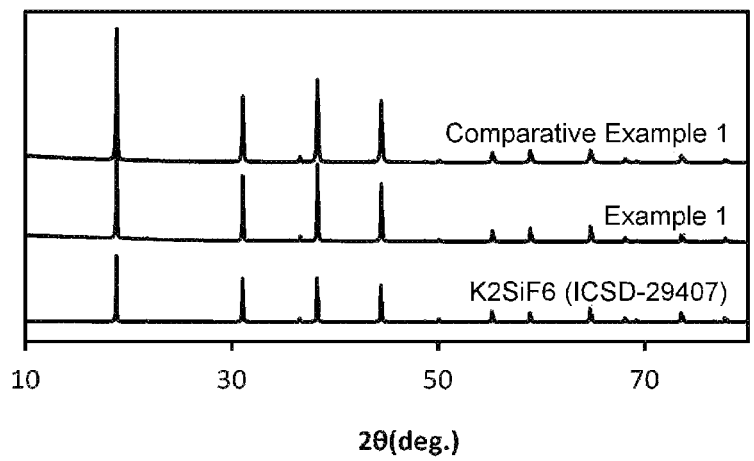
[Fig. 2]
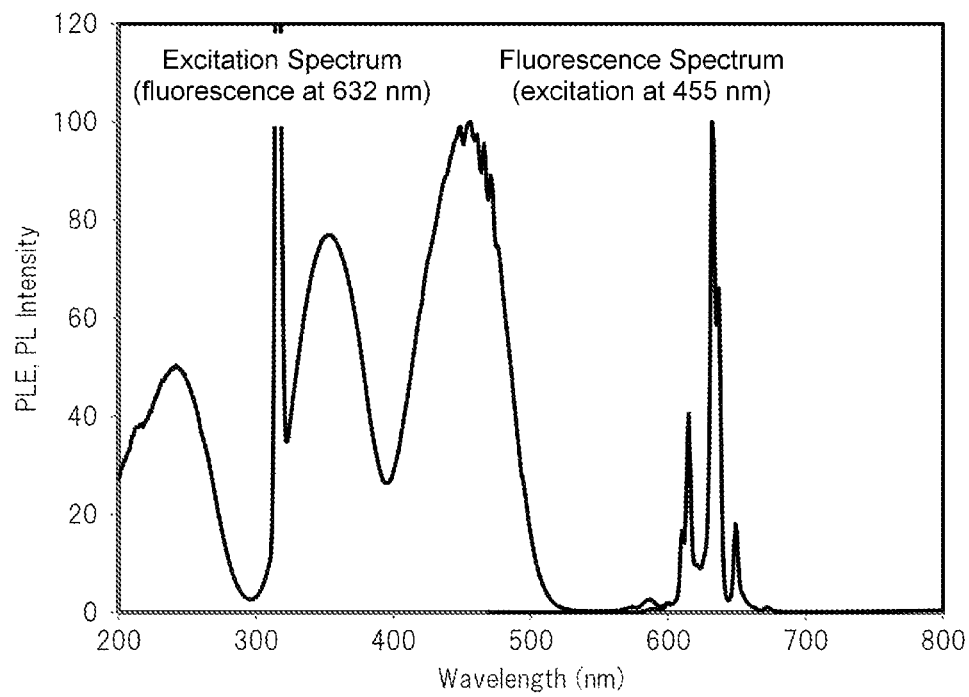

[Fig. 3]
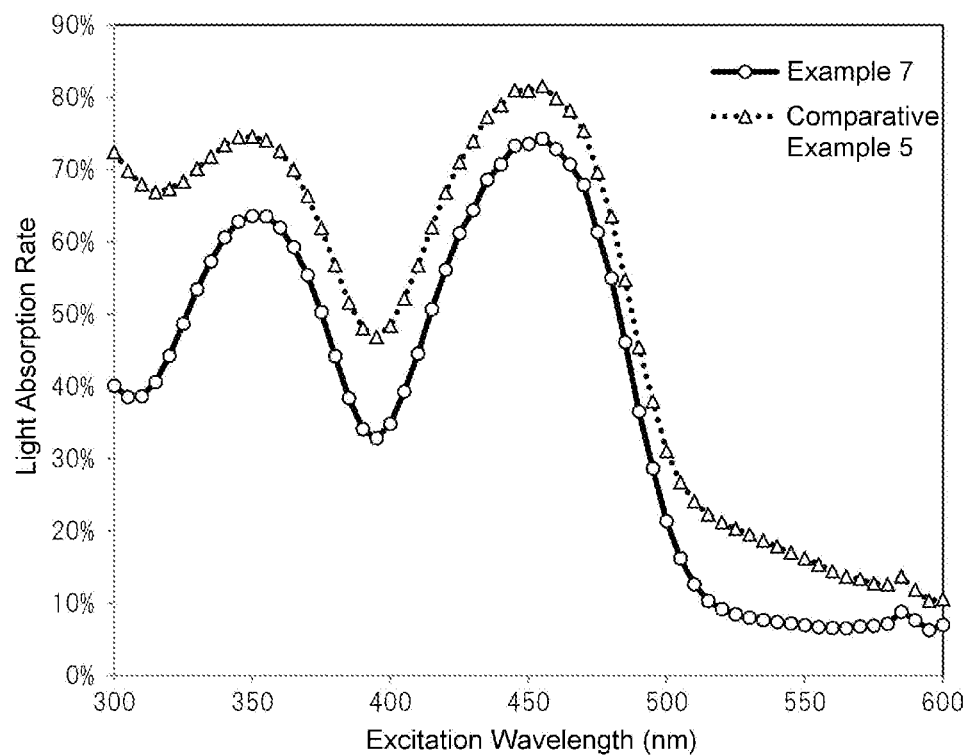
[Fig. 4]
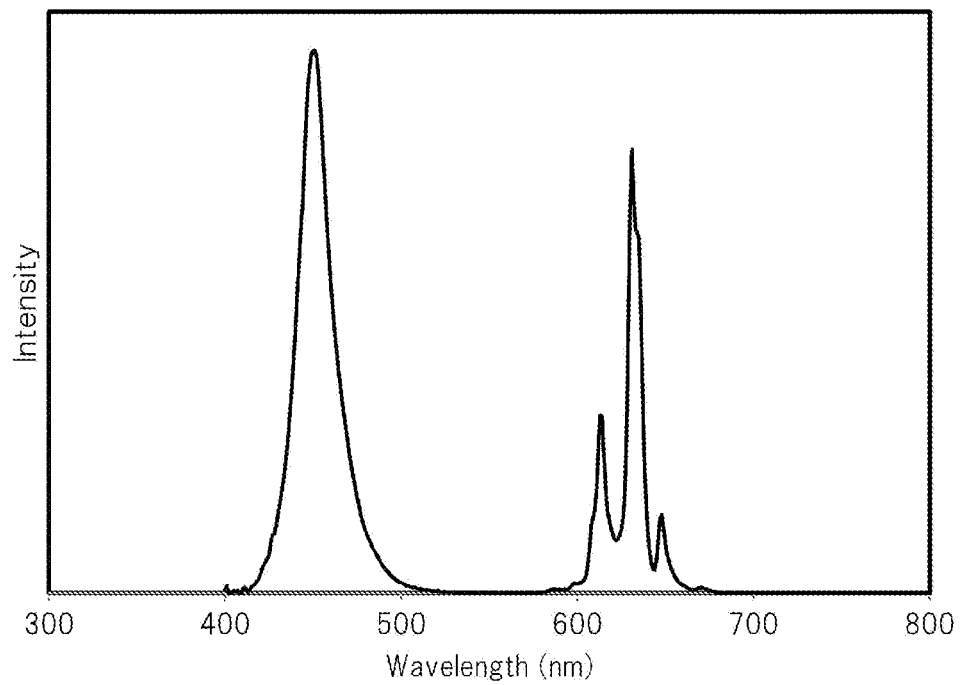

[Fig. 5]
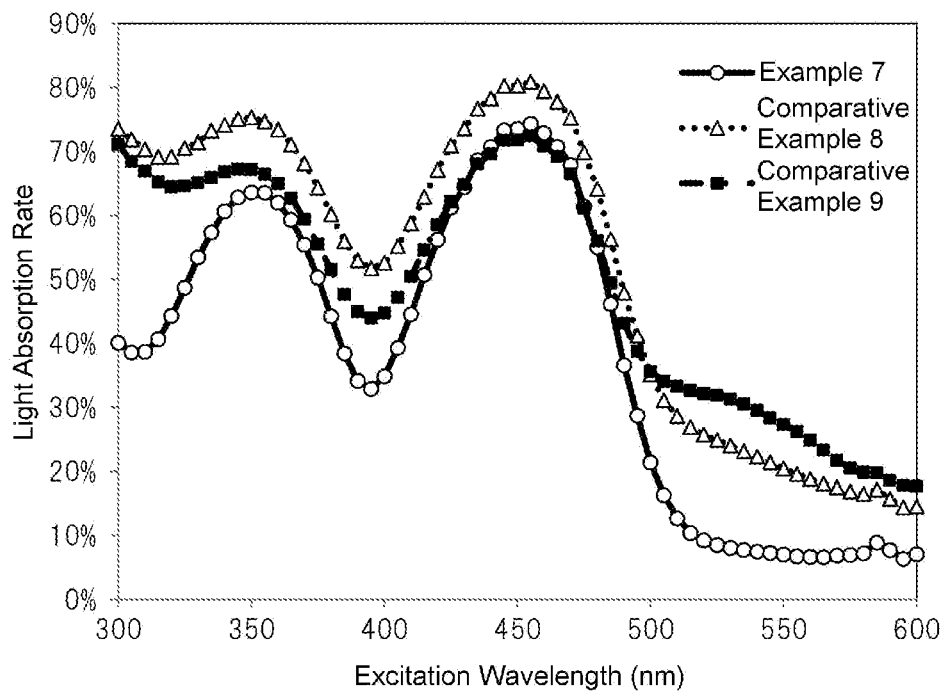
[Fig. 6]
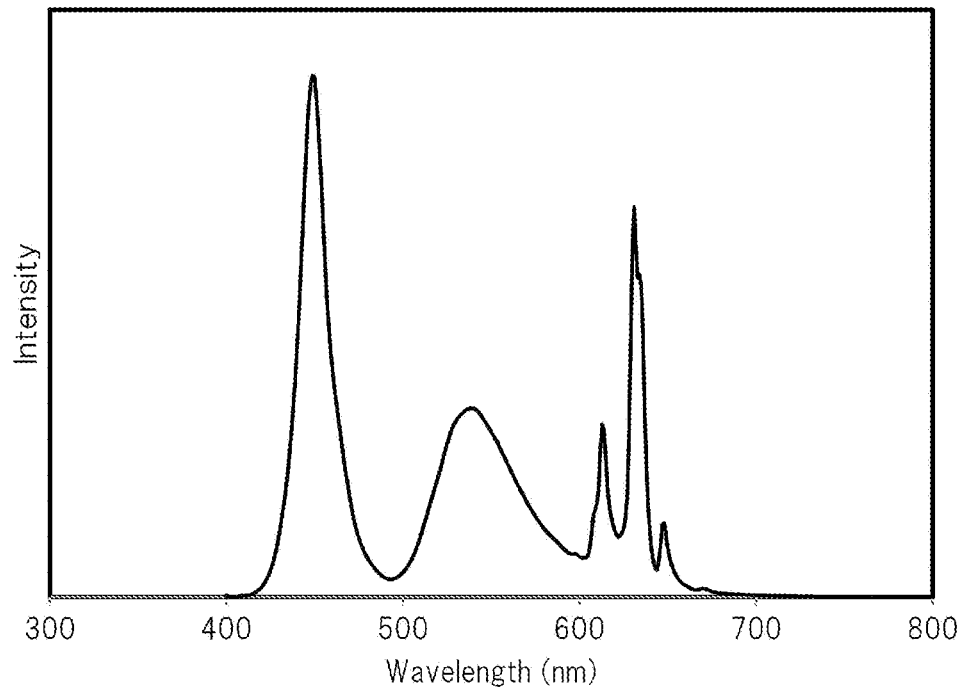

US 10,941,339 B2

FLUORESCENT FLUORIDE, LIGHT-EMITTING DEVICE, AND PROCESS FOR PRODUCING FLORESCENT FLUORIDE

TECHNICAL FIELD

The present invention relates to a fluoride phosphor having high luminescence intensity and also having excellent heat resistance, humidity resistance and quality stability (low variation in quality), a light-emitting device using said fluoride phosphor, and a fluoride phosphor production method.

BACKGROUND ART

In recent years, white light-emitting diodes (white LEDs) combining light-emitting diodes (LEDs) with phosphors have come to be widely used as illumination devices or as backlight light sources in liquid crystal displays. In particular, white LEDs that have InGaN-based blue LEDs as excitation sources have come into widespread use.

As phosphors for use in white LEDs, Ce-activated yttrium-aluminum-garnet (YAG) phosphors that are efficiently excited by blue light and exhibit broad yellow luminescence can be mentioned as representative examples thereof. YAG phosphors, by being combined, alone, with blue LEDs, provide a simulated white color and exhibit a wide range of luminescence in the visible light range, so they are widely used for illumination and as backlight light sources. However, since they have few red chromatic components, they have problems such as poor color rendering properties in illumination applications and narrow color reproducibility ranges in backlight applications.

Therefore, in order to improve the color rendering properties and the color reproducibility in white LEDs combining blue LEDs with YAG phosphors, white LEDs combining red phosphors and green phosphors, such as Eu-activated β-sialon and orthosilicates, which can be excited by the blue LEDs, in addition to the YAG phosphors or instead of the YAG phosphors, are being developed.

As red phosphors for use in white LEDs, nitride or oxynitride phosphors having $Eu^{2+}$ emission centers are often used because they have high fluorescence conversion efficiency, little luminance decrease at high temperatures and excellent chemical stability. Typical examples include the phosphors expressed by the chemical formulae $Sr_2Si_5N_8$:$Eu^{2+}$ $CaAlSiN_3$:$Eu^{2+}$ and $(Ca,Sr)AlSiN_3$:$Eu^{2+}$. However, the luminescence spectra of phosphors using $Eu^{2+}$ are broad and include many luminescence components for which visual sensitivity is low. Therefore, despite having a high fluorescence conversion efficiency, the luminance of the white LEDs is much lower than that of YAG phosphors used alone. Additionally, phosphors that are used in display applications must have good compatibility when combined with color filters, so phosphors having a sharp luminescence spectrum are sought.

As red phosphors having a sharp luminescence spectrum with a narrow half-width, progress has been made in the study of fluoride phosphors that are activated by dissolving $Mn^{4+}$, as a solid solution, in fluoride crystals such as $K_2SiF_6$, and they have been widely applied to white LEDs (Non-Patent Document 1).

Methods for producing phosphors expressed as $K_2SiF_6$:$Mn^{4+}$ include a method in which $K_2SiF_6$ crystals that are to form the base material of the phosphor and $K_2MnF_6$ crystals containing Mn that is to form the emission centers are dissolved in hydrofluoric acid, and the phosphor is re-precipitated by evaporating and drying (Patent Document 1), a method in which a silicon-containing material is immersed in a mixed solution obtained by dissolving $KMnO_4$, an oxidizing agent, into an aqueous hydrofluoric acid solution, and the phosphor is precipitated on the surface layer of the material (Patent Document 2) and a method in which two or more aqueous solutions containing hydrofluoric acid and one or more compounds chosen from among an $SiF_6$ source, a K source and an Mn source are mixed together, and the phosphor is induced to precipitate (Patent Document 3).

Additionally, among methods for producing a phosphor by crystallization from an aqueous solution containing the constituent elements of a fluoride phosphor, proposed improvements include a method in which 0.5 to 10 at % of $Mn^{2+}$ and/or $Mn^{3+}$ are added to the aqueous solution as a means for preventing oxidation of $Mn^{4+}$, which is the main Mn component (Patent Document 4), and a method in which, for the purposes of industrial productivity, various components that provide constituent elements of a fluoride phosphor are sequentially dissolved in water, and from the resulting aqueous solution, a fluoride phosphor is finally precipitated in the solution (Patent Document 5).

RELATED ART DOCUMENTS

Non-Patent Documents

Non-Patent Document 1: A. G. Palulusz, *Journal of The Electrochemical Society*, 1973, vol. 120, no. 7, pp. 942-947.

Patent Documents

Patent Document 1: JP 2009-528429 A
Patent Document 2: WO 2009/119486
Patent Document 3: JP 2012-224536 A
Patent Document 4: JP 2015-140424 A
Patent Document 5: JP 2015-140425 A

SUMMARY OF THE INVENTION

Problems to be Solved by the Invention

However, fluoride phosphors produced by conventional methods tend to have inferior luminescence properties, and are also inadequate in terms of the reliability of the phosphors, such as heat resistance, humidity resistance and quality stability (lowness of variation in quality). For this reason, further improvements to these properties are desired in order to put fluoride phosphors into practical use.

The purpose of the present invention is to offer a fluoride phosphor having high luminescence intensity and reliability, a high-luminance light-emitting device using this phosphor, and a production method for this phosphor.

Means for Solving the Problems

As a result of considering various fluoride phosphor production methods and the physical properties of the resulting phosphors, the present inventors discovered that a fluoride phosphor having excellent luminescence properties and reliability can be obtained by adding solid silicon dioxide and a manganese compound that supplies manganese having a valence other than +7 to an aqueous solution containing constituent elements of the fluoride phosphor, so that the fluoride phosphor precipitates as the solid silicon dioxide concurrently dissolves, thereby arriving at the present invention.

The present invention relates to a production method for a fluoride phosphor represented by the general formula $A_2SiF_6$:Mn (where element A is an alkali metal element including at least potassium), wherein the fluoride phosphor production method comprises a step of preparing an aqueous solution wherein element A and fluorine are dissolved in a solvent; and a step of adding, to the aqueous solution, solid silicon dioxide and a manganese compound that supplies manganese having a valence other than +7; wherein an added amount of the manganese compound is within a range such that an Mn content in the fluoride phosphor becomes at least 0.1 mass % and at most 1.5 mass %; and the fluoride phosphor precipitates as the silicon dioxide concurrently dissolves into the aqueous solution.

In this production method, it is preferable for the manganese compound to be added simultaneously with the addition of the silicon dioxide, or for the manganese compound to be added intermittently after the addition of the silicon dioxide so as to maintain the manganese concentration in the aqueous solution. It is preferable for the manganese compound to supply manganese having a valence of +4. The manganese compound should preferably be a compound that generates $MnF_6^{2-}$ complex ions when dissolved in the aqueous solution, and $K_2MnF_6$ is particularly preferred. Additionally, the silicon dioxide is preferably in powder form, and in particular, it is preferable that the specific surface area thereof be 0.1 to 2 $m^2/g$. The solvent is preferably hydrofluoric acid having a hydrogen fluoride concentration of 40 to 70 mass %. The aqueous solution may contain silicon in a concentration range at which $A_2SiF_6$ crystals do not precipitate.

Additionally, the present invention relates to a fluoride phosphor, in powder form, represented by the general formula $A_2SiF_6$:Mn (where element A is an alkali metal element including at least potassium), having a rate of decrease in integrated fluorescence intensity of at most 3% when the phosphor is exposed for 5 minutes to an environmental temperature of 100° C. after being heated for 5 minutes to 300° C., with respect to the integrated fluorescence intensity when the phosphor is exposed for 5 minutes to an environmental temperature of 100° C. prior to being heated to 300° C.

Furthermore, the present invention relates to a fluoride phosphor, in powder form, represented by the general formula $A_2SiF_6$:Mn (where element A is an alkali metal element including at least potassium), having an absorption rate of at most 50% when irradiated with ultraviolet light having a wavelength of 300 nm, a ratio of at least 78% for internal quantum efficiency at an excitation wavelength of 395 nm with respect to internal quantum efficiency at an excitation wavelength of 455 nm, and an Mn content of at least 0.1 mass % and at most 1.5 mass %.

This fluoride phosphor preferably has an absorption rate of at most 15% when irradiated with green light having a wavelength of 520 nm. Additionally, it is preferable for the volume-based median diameter (D50) to be at least 5 μm and at most 35 μm, and the volume-based cumulative 90% diameter (D90) to be at least 10 μm and at most 50 μm.

Additionally, the present invention relates to a light-emitting device comprising an emission light source and the aforementioned fluoride phosphor, wherein the emission light source has a peak wavelength of at least 420 nm and at most 480 nm. This light-emitting device preferably has a rate of decrease in the emission luminance of less than 5% after being left for 1000 hours in an environment having a temperature of 60° C. and a relative humidity of 90%, while being supplied an electric current of 150 mA. This light-emitting device preferably further comprises a green phosphor having a peak wavelength of at least 510 nm and at most 550 nm when receiving excitation light having a wavelength of 455 nm. The green phosphor is preferably Eu-activated β-sialon.

Effects of the Invention

The fluoride phosphor of the present invention is able to efficiently convert excitation light to fluorescent light, has high luminescence intensity, and has excellent heat resistance, humidity resistance and quality stability. The light-emitting device of the present invention uses said phosphor and therefore has high luminance and excellent reliability. Additionally, according to the fluoride phosphor production method of the present invention, it is possible to produce a fluoride phosphor having high luminescence intensity and excellent reliability.

BRIEF DESCRIPTION OF THE DRAWINGS

FIG. 1 A diagram showing X-ray diffraction patterns for the fluoride phosphor obtained in Example 1, the fluoride phosphor obtained in Comparative Example 1 and $K_2SiF_6$ crystals, wherein the vertical axis in the diagram represents the signal count.

FIG. 2 A diagram showing the excitation and fluorescence spectra of the fluoride phosphor obtained in Example 7.

FIG. 3 A diagram showing the excitation wavelength dependence of the absorption rates of the fluoride phosphors in Example 7 and Comparative Example 5.

FIG. 4 A diagram showing a spectrum of a monochromatic package using the fluoride phosphor of Example 7.

FIG. 5 A diagram showing the excitation wavelength dependence of the absorption rates of the fluoride phosphors in Example 7, Comparative Example 8 and Comparative Example 9.

FIG. 6 A diagram showing the spectrum of the white LED in Example 15.

MODES FOR CARRYING OUT THE INVENTION

<Fluoride Phosphor Production Method>

The fluoride phosphor production method according to the present invention is a production method for a fluoride phosphor represented by the general formula $A_2SiF_6$:Mn (where element A is an alkali metal element including at least potassium), comprising (1) a step of preparing an aqueous solution wherein element A and fluorine are dissolved in a solvent; and (2) a step of adding, to the aqueous solution, solid silicon dioxide and a manganese compound that supplies manganese having a valence other than +7.

(1) Preparation of Aqueous Solution

In this step, an aqueous solution having the element A and fluorine dissolved in a solvent is prepared.

As the solvent, hydrofluoric acid or hydrosilicofluoric acid may be used. These dissolve alkali metal elements while simultaneously acting as fluorine-supplying sources.

When hydrofluoric acid is used as the solvent, the hydrogen fluoride concentration should preferably be 40 to 70 mass %. In particular, since the saturation solubility level of the potassium compound, which is the raw material, depends on the hydrogen fluoride concentration, it is preferable, for the purposes of productivity, to set the hydrogen fluoride concentration to at least 48 mass %. However, if the hydrogen fluoride concentration is too high, the vapor pressure becomes high and the hydrofluoric acid becomes difficult to handle, so the concentration is preferably at most 70 mass %. Since hydrofluoric acid dissolves many substances, the containers and equipment used for handling the hydrofluoric acid should preferably be made of a fluororesin so that they do not become contaminated with impurities.

As mentioned above, the element A is an alkali metal element including at least potassium, and may specifically be potassium alone or may be a combination of potassium with one or more alkali metal elements chosen from among lithium, sodium, rubidium and cesium. Examples of sources for supplying potassium and other alkali metal elements include hydrofluorides (such as $KHF_2$) and fluorides (such as KF). These serve as fluorine sources as well as alkali metal sources and are therefore preferred.

The lower limit of the amount of the element A, essentially containing potassium, which is added to the solvent must exceed the amount that is sufficient to produce enough of the fluoride phosphor, by a reaction, to reach at least the saturation concentration in the aqueous solution. Additionally, the upper limit of the amount of the element A that is added is the saturation solubility level, in the solvent, of the element A compound that is added. These upper and lower limit values change depending on the solvent used and the temperature of the aqueous solution, and therefore, the ranges thereof cannot be uniquely defined.

Additionally, silicon may be dissolved in the aqueous solution within a concentration range in which $A_2SiF_6$ crystals do not precipitate. Examples of compounds that are preferable as silicon sources include silicon dioxide ($SiO_2$), hydrogen silicofluoride ($H_2SiF_6$) and potassium silicofluoride ($K_2SiF_6$). In particular, hydrogen silicofluoride and potassium silicofluoride serve as potassium and fluorine sources as well as silicon sources and are therefore preferred.

Although the alkali metal elements, fluorine and silicon contained in the aqueous solution are generally assumed to be ionized, they are not necessarily required to be free ions, and there are no particular restrictions on the form in which they are present, as long as they are in the state of a solution.

(2) Addition of Silicon Dioxide and Manganese Compound

In this step, solid silicon dioxide and a manganese compound are added to the aqueous solution obtained in step (1).

The solid silicon dioxide may be crystalline, amorphous or a mixture thereof. The solid silicon dioxide may be in bulk or powder form and the form thereof is not limited, but the dissolution rate thereof in the aqueous solution affects the particle form and size of the precipitated phosphor. Considering the ease with which the dissolution rate can be controlled, the silicon dioxide should preferably be in powder form. Additionally, since the solubility level of the silicon dioxide is largely governed by the extent of the interface between the added powder and the aqueous solution, the particle size of the fluoride phosphor can be adjusted by adjusting the specific surface area of the silicon dioxide powder. In order to obtain a fluoride phosphor having an average particle size of 5 to 35 μm, which is appropriate for LED applications, the specific surface area of the silicon dioxide powder added at the time of precipitation thereof should preferably be 0.1 to 2 $m^2/g$.

The manganese compound is preferably able to supply manganese having a valence other than +7, particularly manganese with a valence of +4. Manganese having a valence of +7 does not easily dissolve, as a solid solution, into the base crystal of the fluoride phosphor according to the present invention, and tends not to result in a fluoride phosphor having favorable properties. Preferable manganese compounds easily dissolve in solvents such as hydrofluoric acid and form $MnF_6^{2-}$ complex ions in aqueous solutions, and $K_2MnF_6$, which can dissolve $Mn^{4+}$ ions, as a solid solution, in fluoride crystals expressed by the general formula $A_2SiF_6$, is preferred.

The amount of the manganese compound that is added is within a range such that the Mn content in the fluoride phosphor is at least 0.1 mass % and at most 1.5 mass %. If too little of the manganese compound is added, then sufficient fluorescence emissions cannot be obtained, and if too much is added, then there is a tendency for increased crystal defects and reduced fluorescence emissions due to concentration quenching to occur.

There is no particular restriction on the order in which the solid silicon dioxide and the manganese compound are added as long as this does not interfere with obtaining the phosphor of the present invention. In other words, the manganese compound may be added before adding the silicon dioxide, simultaneously with the addition of the silicon dioxide, or after the silicon dioxide has been added. Additionally, the raw material addition operation is not limited to being just once, and may be divided into multiple stages. For example, the solid silicon dioxide and the manganese compound may be loaded into an aqueous solution containing at least potassium and fluorine all at once, or the raw materials may be divided and added in multiple stages as the precipitation of the phosphor progresses.

Furthermore, potassium, fluorine and a solvent may be added to the aqueous solution after the solid silicon dioxide and the manganese compound are added. Additionally, in some cases, the aqueous solution may be poured onto the solid silicon dioxide and the manganese compound.

In the production method for the fluoride phosphor of the present invention, after the solid silicon dioxide and the manganese compound are added to the aqueous solution in which the element A and the fluorine are dissolved, the precipitation of the fluoride phosphor progresses concurrently with the gradual dissolution of the silicon dioxide into the aqueous solution. This makes use of the effect wherein, as the solid silicon solution dissolves, silicon is supplied to the aqueous solution and reacts with other elements to generate a fluoride phosphor, and the fluoride phosphor reaches the saturation concentration in the aqueous solution, resulting in the precipitation and growth of crystal nuclei.

For this reason, in order to efficiently generate the fluoride phosphor in the present invention, the constituent elements of the fluoride phosphor other than the silicon and manganese contained in the aqueous solution should preferably be present in an amount that is greater than or in significant excess of the stoichiometric amount of the silicon contained in the solid silicon dioxide. Specifically, they should be present in at least an equivalent amount, preferably at least 1.5 times, and more preferably at least 2 times the stoichiometric amount of silicon in the solid silicon dioxide that is dissolved.

The manganese that serves as the emission centers forms a substitutional solid solution by substitution at silicon sites in the fluoride phosphor. Therefore, the manganese distribution/amount in the fluoride phosphor particle can be adjusted by adjusting the timing, number of times and the amounts by which the manganese compound is added to the aqueous solution. For example, if the manganese compound is added before or simultaneously with the addition of the silicon dioxide, then the manganese content in the aqueous solution decreases as the precipitation of the fluoride phosphor progresses, so that the manganese concentration becomes high in the particle centers that are formed in the early stages of precipitation, and the manganese concentration becomes lower as the crystals grow, i.e. towards the outer parts of the particles. Additionally, as another example, by adding the manganese compound after the silicon dioxide is added, it is possible to precipitate a fluoride phosphor in which manganese is not present in the inner parts of the particles, but manganese is present on the outer parts of the particles. Additionally, by intermittently adding the manganese compound after the silicon dioxide has been added so as to maintain the manganese concentration in the aqueous solution, the manganese can be uniformly dispersed throughout the entire phosphor particles.

Although there is no particular limitation on the temperature at which the production method for the fluoride phosphor of the present invention is performed, cooling or heating may be implemented as needed. For example, since silicon dioxide generates heat when dissolved, the temperature may be held constant by cooling the aqueous solution as needed. Additionally, there are no particular restrictions on the pressure at which the method is performed.

The fluoride phosphor obtained by the production method of the present invention can further be post-processed by washing or classification.

The washing step involves recovering the fluoride phosphor precipitated in the aqueous solution by solid-liquid separation by means of filtration or the like, and washing the fluoride phosphor with an organic solvent such as methanol, ethanol or acetone. If the fluoride phosphor is washed with water during the washing step, then some of the phosphor may undergo hydrolysis, resulting in the generation of brown manganese compounds, thereby degrading the properties of the phosphor. For this reason, an organic solvent is used in the washing step. If the fluoride phosphor is washed several times with hydrofluoric acid prior to washing with the organic solvent, it is possible to more reliably dissolve and remove impurities that have been generated in trace amounts. In order to suppress hydrolysis of the fluoride phosphor, the hydrofluoric acid used for washing should preferably have a concentration of at least 15 mass %. The washing step preferably includes a drying step of drying the fluoride phosphor and completely evaporating the washing solution.

The classification step is for reducing disparities in the particle sizes of the fluoride phosphors and adjusting them to be within a certain range. Specifically, it is a step of separation into particles that have and have not passed through a sieve having apertures of a predetermined size.

Additionally, the fluoride phosphor obtained by the production method of the present invention may further be surface-treated by means of a publicly known technique, as needed, for purposes such as improving the humidity resistance and improving the affinity with a sealing resin during mounting.

<Fluoride Phosphor>

The fluoride phosphor according to the present invention is expressed by the general formula $A_2SiF_6$:Mn.

In the general formula, the element A is an alkali metal element including at least potassium, and may specifically be potassium alone or may be a combination of potassium with one or more alkali metal elements chosen from among lithium, sodium, rubidium and cesium. For the purpose of chemical stability, it is preferable for the potassium content to be proportionally higher, and it is more preferable for the alkali metal element to be potassium alone.

In the general formula, Si represents silicon, F represents fluorine and Mn represents manganese.

The "$A_2SiF_6$" on the left side of the general formula indicates the composition of the base crystal of the fluoride phosphor of the present invention, and the ":Mn" on the right side indicates that the activating element that serves as the emission centers in the fluoride phosphor is manganese. This general formula merely indicates the base crystal and the activating element forming the fluoride phosphor of the present invention, and it does not signify that the composition of the fluoride phosphor is homogeneous such that there is always one manganese for every unit of the base crystal no matter how small of a portion is taken. The manganese which is the activating element exhibits red fluorescence emissions by being substituted at silicon sites in the base crystal, and thus should preferably be manganese ions having a valence of +4.

The Mn content in the fluoride phosphor of the present invention is preferably at least 0.1 mass % and at most 1.5 mass %, and more preferably at least 0.5 mass % and at most 1.2 mass %. If the Mn content is too low, then sufficient fluorescence emissions cannot be obtained, and if too high, then there is a tendency for crystal defects to be increased and fluorescence emissions to be reduced due to concentration quenching.

Under normal usage conditions, phosphors that are mounted on light-emitting devices will generally be heated up to a maximum of approximately 150° C. The present inventors discovered that the change in the integrated fluorescence intensity before and after the phosphor is heated to 300° C. serves as an indicator for evaluating long-term deterioration when mounted.

The fluoride phosphor according to the present invention has a rate of decrease in integrated fluorescence intensity of at most 3% when the phosphor is exposed for 5 minutes to an environmental temperature of 100° C. after being heated for 5 minutes to 300° C., with respect to the integrated fluorescence intensity when the phosphor is exposed for 5 minutes to an environmental temperature of 100° C. prior to being heated to 300° C.

The rate of decrease of the integrated fluorescence intensity is determined from the integrated fluorescence intensity ($I(0)$) before being heating to 300° C. and the integrated fluorescence intensity ($I(T)$) after being heated to 300° C., using the following equation.

$$\text{Integrated fluorescence intensity decrease rate (\%)} = (1-[I(T)]/[I(0)]) \times 100$$

If the integrated fluorescence intensity decrease rate is 3% or less, then this indicates that the heat resistance is also sufficient for long-term use, and it is even more preferably at most 2% or at most 1%.

Additionally, the manganese ions serving as the emission centers have multiple valences from +1 to +7, but if there are even trace amounts of ions other than those of valence +4, crystal defects or impurities may be formed and may act as non-emitting light absorption factors, so there is a tendency for the excitation light to be absorbed or the fluorescence to be suppressed. On the other hand, even with manganese ions of valence +4, non-emitting light absorption can similarly occur if they bond with elements other than fluorine such as, for example, oxygen. The number of these non-emitting absorption factors can be estimated from the absorption rates in wavelength ranges at which the light absorption due to valence +4 manganese ions bonded to fluorine have low light absorption. The valence +4 manganese ions that are bonded to fluorine in the fluoride phosphor of the present invention have two broad excitation bands having peaks at wavelengths in the vicinity of 360 nm and in the vicinity of 450 nm, as indicated by the excitation spectra in FIG. 2. The present inventors discovered that non-emitting absorption occurs with particular sensitivity for absorption in (1) a region on the short-wavelength end of the short-wavelength-side excitation band (wavelengths of around 300 nm), and (2) the wavelength region in the valley between the two excitation bands (wavelengths of around 395 nm). Therefore, in order to suppress non-emitting absorption, it is necessary for the absorption rate to be low in both of the wavelength regions (1) and (2).

In the wavelength region (1), the non-emitting absorption rate can be estimated from the absorption rate when irradiated with ultraviolet light having a wavelength of 300 nm, at which almost no excitation occurs in valence +4 manganese ions bonded to fluorine. In the fluoride phosphor of the present invention, the absorption rate at a wavelength of 300 nm is at most 50%, preferably at most 45%, and more preferably at most 40%.

On the other hand, in the wavelength region (2), there is some absorption due to $Mn^{4+}$, contributing to emission in the valley between the two excitation bands, i.e. near the wavelength 395 nm, where there is a minimum in the excitation spectrum. Therefore, the non-emitting absorption cannot be simply estimated from the magnitude of the absorption rate in that wavelength region. Therefore, in the present invention, the ratio between the conversion rate (internal quantum efficiency) to red light when irradiated with blue light having a wavelength of 455 nm, at which $Mn^{4+}$ is most efficiently excited, and the internal quantum efficiency for ultraviolet light having a wavelength of 395 nm, is used as the indicator. In other words, the evaluation is made on the basis of the ratio (%) represented by the following formula:

[Internal quantum efficiency at excitation wavelength of 395 nm]/[Internal quantum efficiency at excitation wavelength of 455 nm]×100

Herebelow, for the sake of convenience, this ratio will be referred to as the "IQE(395)/IQE(455) ratio". The closer this ratio is to 100%, the less non-emitting absorption occurs. In the fluoride phosphor of the present invention, the IQE(395)/IQE(455) ratio is at least 78%, and is preferably at least 80%.

The fluoride phosphor of the present invention is used in combination with a green phosphor, mainly in order to obtain white light. The green light range of $Mn^{4+}$, which is the emission center of the phosphor, is positioned at the end of the absorption band and the conversion efficiency thereof to red light is not very high, so the absorption in that wavelength region is preferably extremely low. For this reason, it is preferable for the absorption rate to be at most 15% when irradiated with green light having a wavelength of 520 nm.

The fluoride phosphor of the present invention should preferably be in powder form, and the particle size thereof should preferably be such that the volume-based median diameter (D50), as determined from a particle size distribution curve measured by laser diffraction/scattering, should preferably be at least 5 µm and at most 35 µm. If the median diameter is too small, then the absorption rate tends to be significantly lower, and if the median diameter is too large, then the amount of the phosphor that must be added to obtain a prescribed color increases, it becomes difficult to mount on an LED due to increases in the viscosity of mixtures with sealing resins, and in some cases, the desired color may not be obtained.

Additionally, the volume-based cumulative 90% diameter (D90) should preferably be at least 10 µm and at most 50 µm. Outside this range, there can be color variations in the LEDs on which the phosphor is mounted, and the dispenser may become clogged during mounting.

<Light-Emitting Device Using Fluoride Phosphor>

The light-emitting device according to the present invention is a light-emitting device comprising the aforementioned fluoride phosphor and an emission light source.

The peak wavelength of the emission light source is at least 420 nm and at most 480 nm, preferably at least 430 nm and at most 470 nm, and more preferably at least 440 nm and at most 460 nm. The peak wavelength of the emission light source is set to at least 420 nm and at most 480 nm because this allows the $Mn^{4+}$, which is the emission center in the phosphor, to be efficiently excited, and can also be used as blue light for the light-emitting device.

The light-emitting device of the present application preferably has a rate of decrease in the emission luminance of less than 5%, more preferably of 3% or less, after being left for 1000 hours in an environment having a temperature of 60° C. and a relative humidity of 90%, while being supplied an electric current of 150 mA.

As a phosphor aside from the aforementioned fluoride phosphor, this light-emitting device preferably further comprises a green phosphor that emits light at a peak wavelength of at least 510 nm and at most 550 nm upon receiving excitation light having a wavelength of 455 nm. This light-emitting device can generate white light by additive mixing of light generated by the blue emission light source, the red fluoride phosphor according to the present invention, and the aforementioned green phosphor. Furthermore, light can be emitted in different color gamuts in accordance with differences in the blending ratio between the phosphors. It is preferable to use, as the green phosphor, an Eu-activated β-sialon phosphor having a fluorescence spectrum with a narrow half-width, since this results in a liquid crystal backlight light source having a wide color gamut.

EXAMPLES

Herebelow, the present invention will be explained in further detail by referring to examples.

<$K_2MnF_6$ Production Process>

The $K_2MnF_6$ used as the raw material for producing the fluoride phosphor of the examples and the comparative examples was prepared by the following method.

800 ml of hydrofluoric acid at a concentration of 40 mass % was poured into a fluororesin beaker having a capacity of 2000 ml, and 260 g of potassium hydrogen fluoride powder (Wako Pure Chemical Industries, special-grade reagent) and 12 g of potassium permanganate powder (Wako Pure Chemical Industries, reagent grade 1) were dissolved therein. While stirring this hydrofluoric acid solution with a magnetic stirrer, 8 ml of 30% hydrogen peroxide water (Wako Pure Chemical Industries, special-grade reagent) were dripped therein a little bit at a time. When the dripped amount of the hydrogen peroxide water exceeded a certain amount, a yellow powder began to precipitate, and the color of the reaction solution began to change from purple. After dripping in a certain amount of hydrogen peroxide water and continuing to stir for a while, the stirring was stopped and the precipitated powder was allowed to settle. After settlement, the operation of removing the supernatant solution and adding methanol was repeated until the solution became neutral. Thereafter, the precipitated powder was recovered by filtration, and further thereto, a drying process was performed so as to completely remove the methanol by evaporation, yielding 19 g of a yellow powder. These operations were all performed at ambient temperature. The X-ray diffraction pattern of the resulting yellow powder was measured using an X-ray diffraction apparatus (Rigaku Ultima IV), as a result of which it was confirmed to consist of $K_2MnF_6$ crystals in a single phase.

Example 1

The fluoride phosphor expressed as $K_2SiF_6$:Mn was produced by the following method. At ambient temperature, 200 ml of hydrofluoric acid at a concentration of 55 mass % was poured into a fluororesin beaker having a capacity of 500 ml, and 25.50 g of a $KHF_2$ powder (Wako Pure Chemical Industries, special-grade reagent) was dissolved therein to prepare an aqueous solution (A). 1.1 g of the $K_2MnF_6$ powder was added to this aqueous solution and completely dissolved, after which 6.90 g of silicon dioxide powder (Denka, FB-50R, amorphous, average particle size 55 μm) was loaded therein. When the silicon dioxide powder was added to the aqueous solution, the generation of dissolution heat caused the temperature of the solution to rise. The solution temperature reached a maximum temperature approximately 3 minutes after the silicon dioxide powder was added, and thereafter, the solution temperature fell because the dissolution of the silicon dioxide powder ended. It was visually observed that a yellow powder began to be generated in the aqueous solution as soon as the silicon dioxide powder was added.

After the silicon dioxide powder completely dissolved, the aqueous solution was stirred for a while, and after the precipitation of the yellow powder was completed, the aqueous solution was placed at rest so as to allow the solid part to settle. After confirming that the solid part had settled, the supernatant solution was removed, the yellow powder was washed with methanol and hydrofluoric acid having a concentration of 20 mass %, then further filtered to separate and recover the solid part. Further thereto, a drying process was performed, thereby evaporating and removing the remaining methanol. After the drying process, a nylon sieve having a mesh size of 75 μm was used to classify and recover only the yellow powder that passed through this sieve, thereby yielding 19.81 g of a yellow powder.

<X-Ray Diffraction Pattern>

The crystal phases of the yellow powder obtained in Example 1 were measured to determine the composition of the base crystal. In other words, the X-ray diffraction pattern was measured using an X-ray diffraction apparatus (Rigaku Ultima 4, using a CuKα tube). The resulting X-ray diffraction pattern is shown in FIG. 1. As a result thereof, the X-ray diffraction pattern of the sample obtained in Example 1 was the same pattern as that of the $K_2SiF_6$ crystal, thereby confirming that $K_2SiF_6$:Mn was obtained in a single phase.

Example 2

A fluoride phosphor was produced by changing the order of addition of the raw materials from that used in Example 1. In other words, at ambient temperature, 200 ml of hydrofluoric acid at a concentration of 55 mass % was poured into a fluororesin beaker having a capacity of 500 ml, and 25.50 g of a $KHF_2$ powder (Wako Pure Chemical Industries, special-grade reagent) was dissolved therein to prepare an aqueous solution (B). 6.90 g of silicon dioxide powder (Denka, FB-50R) and 1.1 g of the $K_2MnF_6$ powder were added to this aqueous solution. The solution temperature began to rise as the silicon dioxide powder dissolved, and in conjunction therewith, it was visually confirmed that a yellow powder began to be generated. After stirring for 3 minutes, the solution temperature fell from the maximum temperature, and it was confirmed that the dissolution of the silicon dioxide powder and the $K_2MnF_6$ in the solution ended. Thereafter, the solution was placed at rest and the solid part was allowed to settle. After confirming that the solid part had settled, the supernatant solution was removed, the remainder was washed with methanol and hydrofluoric acid having a concentration of 20 mass %, then filtered to separate and recover the solid part. Further thereto, a drying process was performed, thereby evaporating and removing the remaining methanol. After the drying process, a nylon sieve having a mesh size of 75 μm was used to classify and recover only the phosphor that passed through this sieve, finally yielding 19.76 g of a yellow powder. The X-ray diffraction pattern of this yellow powder was measured in the same manner as in Example 1, and from the obtained results, the yellow powder in Example 2 was confirmed to be $K_2SiF_6$:Mn in a single phase.

Example 3

A fluoride phosphor was produced by changing the order of addition of the raw materials from those used in Examples 1 and 2. In other words, at ambient temperature, 200 ml of hydrofluoric acid at a concentration of 55 mass % was poured into a fluororesin beaker having a capacity of 500 ml, and 25.50 g of a $KHF_2$ powder (Wako Pure Chemical Industries, special-grade reagent) and a small amount, 0.10 g, of silicon dioxide powder (Denka, FB-50R) were dissolved therein to prepare an aqueous solution (C). 6.80 g of silicon dioxide powder (Denka, FB-50R) and 1.1 g of the $K_2MnF_6$ powder were added to this aqueous solution. The solution temperature began to rise as the silicon dioxide powder dissolved, and it was visually confirmed that a yellow powder began to be generated in conjunction therewith. After stirring for 3 minutes, the solution temperature fell from the maximum temperature, and it was confirmed that the dissolution of the silicon dioxide powder and the $K_2MnF_6$ in the solution ended. After confirming that the solid part had settled, the supernatant solution was removed, the remainder was washed with methanol and hydrofluoric acid having a concentration of 20 mass %, then filtered to separate and recover the solid part. Further thereto, a drying process was performed, thereby evaporating and removing the remaining methanol. After the drying process, a nylon sieve having a mesh size of 75 μm was used to classify and recover only the phosphor that passed through this sieve, finally yielding 19.90 g of a yellow powder. The X-ray diffraction pattern of this yellow powder was measured in the same manner as in Examples 1 and 2, and from the obtained results, the yellow powder in Example 3 was confirmed to be $K_2SiF_6$:Mn in a single phase.

Comparative Example 1

As Comparative Example 1, a fluoride phosphor was produced by a method of immersing a silicon-containing material in a mixed solution prepared by adding $KMnO_4$, which is an oxidizing agent, to an aqueous hydrofluoric acid solution, as disclosed in Patent Document 2.

In other words, at ambient temperature, 100 ml of hydrofluoric acid at a concentration of 48 mass % was poured into a fluororesin beaker having a capacity of 500 ml, and 6.00 g of $KMnO_4$ powder (Wako Pure Chemical Industries, reagent grade 1) and 100 m of $H_2O$ were mixed therein to prepare a solution. Meanwhile, degreasing was performed by washing with acetone for 10 minutes while applying ultrasonic waves, and subsequent thereto, washing with methanol for 10 minutes. Thereafter, 0.38 g of an n-type Si single-crystal substrate from which a naturally occurring oxide film was removed by using an aqueous 5% HF solution was prepared, and placed in the aforementioned solution. The solution was then left to stand at room temperature (25° C.) for 2 days, and thereafter, the supernatant solution was removed. It was confirmed that a yellow powder was formed on the n-type Si single-crystal substrate that was immersed. The yellow powder formed on the Si substrate was isolated visually, washed with methanol, and filtered to separate and recover the solid part. Further thereto, the remaining methanol was evaporated and removed by a drying process, thus finally yielding 1.48 g of a pale yellow powder.

Upon using an X-ray diffraction apparatus (Rigaku Ultima 4, using a CuKα tube) to measure the X-ray diffraction pattern, the same pattern as that of $K_2SiF_6$ crystals was exhibited, as in the case of Example 1 (FIG. 1).

Comparative Example 2

As Comparative Example 2, a fluoride phosphor was produced by a method of mixing a first solution containing a silicon fluoride with a second solution containing an alkali element, and recovering a solid product, as disclosed in Patent Document 3.

In other words, at ambient temperature, 140 ml of hydrofluoric acid at a concentration of 48 mass % was poured into a fluororesin beaker having a capacity of 500 ml, and 6.86 g of silicon dioxide powder (Kojundo Chemical Laboratory, 99% pure) and 1.70 g of $K_2MnF_6$ were dissolved therein to prepare a first solution. Additionally, 60 ml of hydrofluoric acid at a concentration of 48 mass % was poured into a fluororesin beaker having a capacity of 500 ml, and 19.93 g of potassium fluoride was dissolved therein to prepare a second solution. These solutions were mixed together, then placed at rest so as to allow the solid part to settle. After confirming that the solid part had settled, the supernatant solution was removed, the remainder was washed with ethanol and hydrofluoric acid having a concentration of 20 mass %, then separated and recovered by filtration, and further thereto, a drying process was performed so as to completely remove the ethanol by evaporation. After the drying process, 21.69 g of a yellow powder was finally obtained.

<Luminescence Property Evaluation of Fluoride Phosphor>

The luminescence properties of the fluoride phosphors obtained by the production methods of Examples 1, 2 and 3, and Comparative Examples 1 and 2 were evaluated by measuring the absorption rates, internal quantum efficiencies and external quantum efficiencies thereof by the following methods.

A standard reflective plate (Labsphere Spectralon) having a reflectivity of 99% was set at a side-surface aperture (ϕ 10 mm) of an integrating sphere (ϕ 60 mm), and monochromatic light divided into a wavelength of 455 nm from an emission light source (Xe lamp) was guided to this integrating sphere by an optical fiber, and the spectrum of the reflected light was measured using a spectrophotometer (Otsuka Electronics MCPD-7000). At that time, the number of excitation light photons (Qex) was calculated using the spectrum in the wavelength range from 450 to 465 nm. Next, recessed cells filled with the phosphor so that the surfaces were flat were set at the aperture of the integrating sphere and illuminated with monochromatic light of wavelength 455 nm, and the spectra of the reflected excitation light and the fluorescent light were measured by the spectrophotometer. The number of photons of the reflected excitation light (Qref) and the number of photons of fluorescent light (Qem) were calculated from the resulting spectral data. The number of reflected excitation light photons was calculated in the same wavelength range as the number of excitation light photons, and the number of fluorescent light photons was calculated in the range from 465 to 800 nm. From the numbers of these three types of photons, the external quantum efficiency (=Qem/Qex×100), the absorption rate (=(1−Qref/Qex)×100) and the internal quantum efficiency (=Qem/(Qex−Qref)×100) were determined.

The quantum efficiencies of the fluoride phosphor of Example 1 using $K_2MnF_6$ as the compound serving as the manganese source were such that the absorption rate was 81%, the internal quantum efficiency was 76% and the external quantum efficiency was 62%. On the other hand, the quantum efficiencies of the fluoride phosphor of Comparative Example 1 using $KMnO_4$, which forms manganese ions having a valence of +7, as the compound serving as the manganese source, were such that the absorption rate was 78%, the internal quantum efficiency was 51% and the external quantum efficiency was 40%. It can be seen that Example 1 exhibited much better luminescence properties than Comparative Example 1. When measured by the same method, the fluoride phosphor of Example 2 had an absorption rate of 81%, an internal quantum efficiency of 80% and an external quantum efficiency of 65%, and the fluoride phosphor of Example 3 had an absorption rate of 80%, an internal quantum efficiency of 80% and an external quantum efficiency of 64%. Additionally, the fluoride phosphor of Comparative Example 2 had an absorption rate of 61%, an internal quantum efficiency of 67% and an external quantum efficiency of 41%. These measurement results are shown together in Table 1. From Table 1, it was confirmed that the luminescence properties of the fluoride phosphors obtained by the production methods of Examples 1, 2 and 3 were higher than those of Comparative Examples 1 and 2 in all of the categories, and were thus superior.

TABLE 1

| | Optical Properties (excitation at 455 nm, units in %) | | |
|---|---|---|---|
| | Absorption Rate | Internal Quantum Efficiency | External Quantum Efficiency |
| Example 1 | 81 | 76 | 62 |
| Example 2 | 81 | 80 | 65 |
| Example 3 | 80 | 80 | 64 |
| Comparative Example 1 | 78 | 51 | 40 |
| Comparative Example 2 | 61 | 67 | 41 |

<Evaluation of Quality Variation>

Using the production methods of Example 1 and Comparative Example 2, for which the productivity is approximately the same, fluoride phosphors were synthesized 10 times each, the luminescence properties (external quantum efficiencies) of each of the 10 produced samples were measured, and the quality variation was compared and evaluated. The external quantum efficiencies of each of the produced samples, and their mean and standard deviation, are shown in Table 2. As shown in Table 2, the mean and standard deviation of the external quantum efficiencies of the fluoride phosphor synthesized using the production method of Example 1 were 62% and 1.2%. On the other hand, the mean and standard deviation of the external quantum efficiencies of the fluoride phosphors of Comparative Example 2 were 41% and 1.9%. The fluoride phosphors obtained by the production method of Example 1 exhibited better luminescence properties than Comparative Example 2, and also had less quality variation.

TABLE 2

| | External Quantum Efficiency (excitation at 455 nm, units in %) | | | | |
| --- | --- | --- | --- | --- | --- |
| | 1st | 2nd | 3rd | 4th | 5th |
| Example 1 | 62 | 62 | 61 | 63 | 64 |
| Comparative Example 2 | 41 | 38 | 43 | 42 | 39 |

| | 6th | 7th | 8th | 9th | 10th | Mean | Standard Deviation |
| --- | --- | --- | --- | --- | --- | --- | --- |
| Example 1 | 62 | 62 | 61 | 64 | 61 | 62 | 1.2 |
| Comparative Example 2 | 40 | 39 | 40 | 41 | 44 | 41 | 1.9 |

<Heat Resistance Evaluation>

The heat resistance properties of the fluoride phosphors of Examples 1, 2 and 3, and Comparative Examples 1 and 2 were evaluated by the following method. First, a cylindrical quartz cell having an inner diameter of 15 mm and a depth of 3 mm was filled with phosphor so that the surface was flat, then set on a microscope heating stage (Japan High Tech) installed in a dark box. Inside this dark box, it is possible to irradiate a sample vertically from above with excitation light transmitted through an optical fiber, and to measure the fluorescence spectrum generated by the sample at that time by means of a spectrophotometer (Otsuka Electronics MCPD-7000), through an optical fiber that is set at an angle of 45° with respect to the excitation light. After setting the sample, the heating stage was adjusted to 100° C., and upon confirming, by means of a temperature monitor, that a temperature of 100° C. was reached, the condition was maintained for 10 minutes, after which the sample was irradiated with monochromatic light having a wavelength of 455 nm, divided from an Xe lamp, and the fluorescence spectrum was measured. The integrated fluorescence intensity I(0) in the wavelength range from 465 to 800 nm was calculated from the resulting fluorescence spectrum. Thereafter, the heating stage was adjusted to 300° C., and upon confirming that the temperature was 300° C. by means of the temperature monitor, the condition was maintained for 10 minutes. After the maintenance period ended, the heating stage was adjusted once again to 100° C., and after confirming that a temperature of 100° C. was reached by means of the temperature monitor, the condition was maintained for 10 minutes, and then the integrated fluorescence intensity I(T) of the fluorescence spectrum was determined by using the above-mentioned measurement method. From the integrated fluorescence intensities I(0) and I(T) obtained in this way, the integrated fluorescence intensity decrease rate was calculated in accordance with the following equation:

Integrated Fluorescence Intensity Decrease Rate (%)=(1−[$I(T)$]/[$I(0)$])×100

The integrated fluorescence intensity decrease rate (%) after subjecting the fluoride phosphors to the heating test are shown in Table 3. As shown in Table 3, the integrated fluorescence intensities of the fluoride phosphors of Comparative Examples 1 and 2 significantly decreased, by 6.3% and 5.2%, after the heating test, whereas the decrease rates after the heating test for the fluoride phosphors of Examples 1, 2 and 3 were respectively held to 2.1%, 0.3% and 0.4%.

TABLE 3

| | Integrated Fluorescence Intensity Decrease Rate (%) After Heating Test |
| --- | --- |
| Example 1 | 2.1 |
| Example 2 | 0.3 |
| Example 3 | 0.4 |
| Comparative Example 1 | 6.3 |
| Comparative Example 2 | 5.2 |

Examples 4, 5 and 6, and Comparative Examples 3 and 4

In Examples 4, 5 and 6, the fluoride phosphors of Examples 1, 2 and 3, and in Comparative Examples 3 and 4, the fluoride phosphors of Comparative Examples 1 and 2 were respectively added to a silicone resin together with a β-sialon green phosphor (Denka, GR-MW540K), degassed and kneaded, then potted into surface-mounted packages joined to blue LED elements having a peak wavelength of 455 nm, and thermally cured to produce white LEDs. The ratios between the added amounts of the fluoride phosphors and the β-sialon green phosphors were adjusted so that the chromaticity coordinates (x, y) of the white LEDs, when supplied with power and emitting light, were (0.28, 0.27).

<Light-Emitting Device Heat Resistance and Humidity Resistance Evaluation>

The stabilities of the light-emitting devices according to Examples 4, 5 and 6, and Comparative Examples 3 and 4, under high-temperature, high-humidity conditions, were evaluated by the following method.

Each device was left for 100 hours in an environment having a temperature of 60° C. and a relative humidity of 90%, while being supplied an electric current of 150 mA. The emission luminance of each device before and after exposure to the high-temperature, high-humidity environment was measured, and the emission luminance decrease rate, as compared to the emission luminance before testing, was calculated.

The emission luminance decrease rates after the high-temperature, high-humidity tests of the light-emitting devices are shown in Table 4. As shown in Table 4, in the light-emitting devices in Comparative Examples 3 and 4, the emission luminance in each after the high-temperature, high-humidity test significantly decreased, by 8.9% and 6.7%. However, in the light-emitting devices according to Examples 4, 5 and 6, the decrease rates after the high-temperature, high-humidity test were only 4.7%, 2.3% and 2.7%.

TABLE 4

| | Emission Luminance Decrease Rate (%) After High-Temperature High-Humidity Test |
|---|---|
| Example 4 | 4.7 |
| Example 5 | 2.3 |
| Example 6 | 2.7 |
| Comparative Example 3 | 8.9 |
| Comparative Example 4 | 6.7 |

Example 7

At ambient temperature, 1000 ml of hydrofluoric acid at a concentration of 55 mass % was poured into a fluororesin beaker having a capacity of 2000 ml, and 127.5 g of potassium hydrogen fluoride powder (Wako Pure Chemical Industries, special-grade reagent) was dissolved therein to prepare an aqueous solution. While stirring this aqueous solution, 34.5 g of a silicon dioxide powder (Denka FB-50R, amorphous, specific surface area 0.4 m$^2$/g) and 4.5 g of a K$_2$MnF$_6$ powder were simultaneously added. When the powders were added to the aqueous solution, the dissolution heat of the silicon dioxide caused the temperature of the aqueous solution to rise. The solution temperature reached a maximum temperature (approximately 40° C.) approximately 3 minutes after the powder was added, and thereafter, the dissolution of the silicon dioxide ended, so the solution temperature fell. When a white silicon dioxide powder was added, a yellow powder immediately began to be generated in the aqueous solution, thus confirming that the dissolution of the silicon dioxide powder occurred simultaneously with the precipitation of the yellow powder.

The aqueous solution was stirred for a while even after the silicon dioxide powder completely dissolved, and the precipitation of the yellow powder was completed. Thereafter, the solution was placed at rest and the solid part was allowed to settle. After confirming that the solid part had settled, the supernatant solution was removed, the yellow powder was washed with methanol and hydrofluoric acid having a concentration of 20 mass %, then filtered to separate and recover the solid part. Further thereto, a drying process was performed, thereby evaporating and removing the remaining methanol. After the drying process, a nylon sieve having a mesh size of 75 μm was used to classify and recover only the phosphor that passed through this sieve, finally yielding 99 g of a yellow powder.

The X-ray diffraction pattern of the resulting yellow powder was measured using an X-ray diffraction apparatus (Rigaku Ultima IV). As a result thereof, the X-ray diffraction pattern of the sample obtained in Example 7 was the same pattern as that for a K$_2$SiF$_6$ crystal, so it was confirmed that K$_2$SiF$_6$:Mn was obtained in a single phase.

The excitation and fluorescence spectra of Example 7 were measured using a spectrofluorophotometer (Hitachi High-Technologies F-7000). The excitation wavelength of the fluorescence spectrum for this measurement was 455 nm, and the monitor wavelength for the excitation spectrum was 632 nm. FIG. 2 shows the measurement results for the excitation and fluorescence spectra of the phosphor in Example 7.

<Absorption Rate>

The excitation wavelength dependence of the absorption rate of the phosphor in Example 7 was measured at ambient temperature by means of the following method. A standard reflective plate (Labsphere Spectralon) having a reflectivity of 99% was set at a side-surface aperture (φ 10 mm) of an integrating sphere (φ 60 mm). Monochromatic light divided into a prescribed wavelength from an Xe lamp used as an emission light source was guided by an optical fiber, as excitation light, to this integrating sphere, and the spectrum reflected from the standard reflective plate was measured, in the wavelength range from 220 to 800 nm, using a spectrophotometer (Otsuka Electronics MCPD-7000). Excitation light was generated at intervals of 5 nm within the range from 300 to 700 nm, and the spectrum of the reflected light was measured for the excitation light at each wavelength. Next, a recessed cell filled with a phosphor so that the surface was flat was set in the aperture of the integrating sphere, and as in the case of the reflective plate, irradiated with monochromatic light in the range from 300 to 700 nm, at intervals of 5 nm, and the spectrum was measured for the excitation light at each wavelength.

The resulting spectra consisted of an excitation light reflection spectrum and a fluorescence spectrum in the red vicinity. In the resulting spectra, the number of photons in the reflected excitation light was measured within the range from −5 to +10 nm of the set excitation wavelength, and absorption rate of the phosphor at each excitation wavelength was calculated from the following equation:

Absorption Rate (%)=(1−[Number of photons of excitation light reflected by phosphor]/[Number of photons of excitation light reflected by standard reflective plate])×100

The absorption rate of the phosphor of Example 7 measured in this way, as plotted against the excitation wavelength, is shown in FIG. 3. The absorption rate exhibited a maximum value at excitation wavelengths of 350 nm and 450 nm due to excitation of Mn$^{4+}$.

Comparing the excitation spectrum in FIG. 2 with the wavelength dependence of the absorption spectrum in FIG. 3, they seem to indicate very similar behavior, but it can be seen that the absorption rate is higher than the excitation intensity in the wavelength region of 350 nm or less. The excitation spectrum in FIG. 2 shows absorption based only on electron transitions in Mn$^{4+}$, whereas the absorption rate in FIG. 3 shows not only the electron transitions in Mn$^{4+}$, but also all light absorption including that not associated with red light emission. For this reason, a smaller difference indicates that the amount of non-emitting light absorption is smaller, and thus that the quality of the phosphor is higher. As a representative indicator thereof, attention was focused on the absorption rate at a wavelength of 300 nm, at which almost no Mn$^{4+}$ excitation occurs. The absorption rate of the fluoride phosphor of Example 7, when irradiated with light having a wavelength of 300 nm, was 40%.

Furthermore, the absorption rate at a wavelength of 520 nm, which is an important indicator when contemplating a combination with a green phosphor, was 9%.

<IQE(395)/IQE(455) Ratio>

The internal quantum efficiencies when irradiated with light at a wavelength of 395 nm, which is in the valley between the two absorption bands for Mn$^{4+}$, and a wavelength of 455 nm, near which the maximum value of the long-wavelength-side absorption band occurs, were measured by means of the following method. First, measurements were made in the same manner as in the case for determining the absorption rate, and for both the wavelength 395 nm and the wavelength 455 nm, the number of photons in the excitation light reflected by the standard reflective plate (Qex) and the number of photons in the excitation light reflected by the phosphor (Qref) were measured, and the number of photons absorbed by the phosphor (Qex−Qref) were determined. Furthermore, the number of photons of fluorescent light (Qem) at each wavelength was calculated in the range from 465 to 800 nm. The resulting numbers of fluorescent light photons (Qem) were divided by the numbers of photons absorbed by the phosphor (Qex−Qref) to determine the internal quantum efficiencies IQE(395) and IQE(455) when excited with light of wavelengths 395 nm and 455 nm, and the IQE(395)/IQE(455) ratio was calculated. The IQE(395)/IQE(455) ratio of the fluoride phosphor of Example 7 was 90%.

<Mn Content>

The Mn content was measured by ICP (Inductively Coupled Plasma) emission spectroscopy. The Mn content in the fluoride phosphor of Example 7 was 0.58 mass %.

<Particle Size Distribution>

The particle size distribution of the fluoride phosphor was measured by means of a laser diffraction/scattering-type particle size distribution measuring device (Beckman Coulter LC13 320). From the resulting cumulative particle size distribution curve, the volume-based median diameter (D50) and the volume-based cumulative 90% diameter (D90) were determined. The D50 and D90 of the fluoride phosphor of Example 7 were respectively 29 μm and 42 μm. Ethanol was used as the measuring solvent in the measuring device.

Comparative Examples 5 and 6

As comparative examples, fluoride phosphors were synthesized in accordance with the method disclosed in Patent Document 3. With this method, as described in detail below, a first solution, in which silicon and a manganese compound expressed as $K_2MnF_6$ were dissolved, was mixed with potassium hydrogen fluoride powder or a second solution in which potassium hydrogen fluoride was dissolved.

First, at ambient temperature, 700 ml of hydrofluoric acid at a concentration of 48 mass % was poured into a fluororesin beaker having a capacity of 2000 ml, and 34.3 g of silicon dioxide powder (Kojundo Chemical Laboratory, 99% pure) and 8.5 g of $K_2MnF_6$ were dissolved therein to prepare a first solution.

Additionally, 300 ml of hydrofluoric acid at a concentration of 48 mass % was poured into a fluororesin beaker having a capacity of 500 ml, and 100 g of potassium hydrogen fluoride was dissolved therein to prepare a second solution.

In Comparative Example 5, the second solution was mixed into the first solution. In Comparative Example 6, 100 g of potassium hydrogen fluoride powder was added to the first solution. When the second solution or the potassium hydrogen fluoride powder was added to the first solution, a yellow powder began to precipitate in both cases. After the solution was stirred for a while and the precipitation reaction was completed, the solution was placed at rest so as to allow the solid part to settle. After confirming that the solid part had settled, the supernatant solution was removed, the remainder was washed with methanol and hydrofluoric acid having a concentration of 20 mass %, then further filtered to separate and recover the solid part. The recovered solid part was dried, and the remaining ethanol was evaporated and removed. After the drying process, a yellow powder was finally obtained, in the amount of 108.5 g in Comparative Example 5, and in the amount of 99.8 g in Comparative Example 6. As in Example 7, X-ray diffraction measurements were performed, and it was confirmed that both powders were $K_2SiF_6$:Mn in a single phase.

The fluoride phosphor of Comparative Example 5 had adsorption rates, at wavelengths of 300 nm and 520 nm, of respectively 73% and 23%. The IQE(395)/IQE(455) ratio was 65%. Additionally, the Mn concentration was 1.06 mass %, and D50 and D90 were respectively 28.8 μm and 43.5 μm.

The fluoride phosphor of Comparative Example 6 had adsorption rates, at wavelengths of 300 nm and 520 nm, of respectively 48% and 10%. The IQE(395)/IQE(455) ratio was 51%. Additionally, the Mn concentration was 0.78 mass %, and D50 and D90 were respectively 14.9 μm and 22.0 μm.

<Monochromatic Package Luminance and Reliability Evaluations>

The fluoride phosphors of Example 7 and Comparative Examples 5 and 6 were respectively added to a silicone resin, degassed and kneaded, then potted into surface-mounted packages joined to blue LED elements having a peak wavelength of 450 nm, and thermally cured to produce monochromatic packages. The added amounts of the fluoride phosphor were adjusted so that the chromaticity coordinates (x, y) of the monochromatic packages, when supplied with power and emitting light, were (0.245, 0.078). From the resulting white LEDs, ten in which the chromaticity x was within the range from 0.240 to 0.250 were chosen, the total luminous fluxes when supplied with power and emitting light were measured by a total luminous flux measurement device manufactured by Otsuka Electronics (combination of diameter 300 mm integrating hemisphere and spectrophotometer/MCPD-9800), and the mean was calculated. FIG. 4 shows a spectrum of a monochromatic package using the fluoride phosphor of Example 7. When the mean total luminous flux of monochromatic packages using the fluoride phosphor of Comparative Example 5 is defined to be 100%, the mean total luminous fluxes of monochromatic packages using the fluoride phosphors of Example 7 and Comparative Example 6 were respectively 108% and 87%.

Next, in order to study the reliability of the above-mentioned monochromatic packages, three monochromatic packages using each fluoride phosphor were chosen, and tests were performed in which these were supplied with power and lit for 1000 hours in a constant-temperature constant-humidity tank (manufactured by Espec Corp., SH-642), set to a temperature of 85° C. and a relative humidity of 85%. When a fluoride phosphor deteriorates, the intensity of red light emission decreases and the chromaticity x falls. Therefore, the mean color shift (Δx) for n=3 samples, 1000 h after being initially lit, was determined. The Δx of the white LEDs using the fluoride phosphors of Example 7 and Comparative Examples 5 and 6 were, respectively, −0.004, −0.015 and −0.018.

It was confirmed that, by using the fluoride phosphor of Example 7, an LED with excellent luminance and high reliability can be obtained, compared to the cases in which the phosphors of the comparative examples are used.

Examples 8 to 11 and Comparative Example 7

In Examples 8 and 9 and Comparative Example 7, fluoride phosphors were produced by the same method as that in Example 7, except that the added amounts of the $K_2MnF_6$ and the silicon dioxide were changed as indicated in Table 5 below. In Examples 10 and 11, fluoride phosphors were obtained by the same method as that in Example 7, except that the concentration of the hydrofluoric acid, which was the solvent, was changed as shown in Table 5.

Examples 12 and 13

In Examples 12 and 13, fluoride phosphors were obtained by the same method as that in Example 7, except that the specific surface area of the silicon dioxide powder was changed as shown in Table 5.

Example 14

In Example 14, 2.25 g of the $K_2MnF_6$ powder was added simultaneously with the addition of the silicon dioxide powder, and 1 minute and 30 seconds after the addition thereof, the remaining 2.25 g of the $K_2MnF_6$ powder were added with some of the silicon dioxide remaining in the aqueous solution, in powder form, without being completely melted. Aside therefrom, a fluoride phosphor was obtained by the same method as that in Example 7.

The production conditions for the fluoride phosphor of Examples 7-14 and Comparative Example 7 are shown in Table 5.

Additionally, the absorption rates at the wavelengths 300 nm and 520 nm, the IQE(395)/IQE(455) ratio, the particle size distribution (D50, D90), the Mn content and the total luminous flux and chromaticity x shift ($\Delta x$) of monochromatic packages, for the fluoride phosphors of Examples 7-14 and Comparative Examples 5-7, are shown in Table 6.

TABLE 5

|  | $K_2MnF_6$ Amount (g) | Hydrofluoric Acid HF Concentration (mass %) | Silicon Dioxide Amount (g) | Specific Surface Area of Silicon Dioxide Powder ($m^2/g$) |
| --- | --- | --- | --- | --- |
| Example 7 | 4.5 | 55 | 34.5 | 0.4 |
| Example 8 | 6 | 55 | 34.5 | 0.4 |
| Example 9 | 12 | 55 | 33.5 | 0.4 |
| Example 10 | 4.5 | 50 | 34.5 | 0.4 |
| Example 11 | 4.5 | 60 | 34.5 | 0.4 |
| Example 12 | 4.5 | 55 | 34.5 | 1.1 |
| Example 13 | 4.5 | 55 | 34.5 | 1.6 |
| Example 14 | 4.5[1)] | 55 | 34.5 | 0.4 |
| Comparative Example 7 | 20 | 55 | 32.5 | 0.4 |

[1)]$K_2MnF_6$ added in two batches

TABLE 6

|  | Absorption Rate (%) | | IQE(395)/ IQE(455) Ratio (%) | Particle Size (μm) | | Mn Content (mass %) | Monochromatic Package | |
| --- | --- | --- | --- | --- | --- | --- | --- | --- |
|  | 300 nm | 520 nm |  | D50 | D90 |  | Total Luminous Flux | $\Delta x$[1)] |
| Example 7 | 40 | 9 | 90 | 28.6 | 42.3 | 0.58 | 108 | −0.004 |
| Example 8 | 42 | 12 | 89 | 27.5 | 41.5 | 0.65 | 106 | −0.005 |
| Example 9 | 45 | 12 | 83 | 28.8 | 40.3 | 1.2 | 105 | −0.008 |
| Example 10 | 36 | 12 | 94 | 22.5 | 31.2 | 0.62 | 102 | −0.005 |
| Example 11 | 42 | 13 | 88 | 51.2 | 81.9 | 0.6 | 108 | −0.008 |
| Example 12 | 33 | 12 | 83 | 16.7 | 22.1 | 0.61 | 101 | −0.006 |
| Example 13 | 29 | 11 | 85 | 11.8 | 20.1 | 0.58 | 96 | −0.012 |
| Example 14 | 27 | 10 | 83 | 27.9 | 43.3 | 0.66 | 110 | −0.002 |
| Comparative Example 5 | 73 | 23 | 74 | 28.8 | 43.5 | 1.06 | 100 | −0.015 |
| Comparative Example 6 | 48 | 10 | 51 | 14.9 | 22 | 0.78 | 87 | −0.018 |
| Comparative Example 7 | 63 | 18 | 65 | 29.3 | 43.3 | 2.1 | 92 | −0.023 |

[1)]Shift from initial chromaticity x value after test supplying power for 1000 h at 85° C. and 85% RH

Comparative Examples 8 and 9

In Comparative Example 8, a fluoride phosphor was synthesized in accordance with the method disclosed in Patent Document 1. At ambient temperature, 1000 ml of hydrofluoric acid at a concentration of 55 wt % was poured into a fluororesin beaker having a capacity of 3000 ml, and 30 g of a $K_2SiF_6$ powder (Morita Chemical Industries, purity at least 98%) and 5 g of a $K_2MnF_6$ powder were added, then stirred well. Next, while stirring this aqueous hydrofluoric acid solution, 1500 ml of distilled water were poured in from a beaker in approximately 1 minute. It was visually confirmed that a yellow powder was generated in the reaction solution due to the addition of the distilled water. After the total amount of the distilled water was added, the solution was further stirred for 20 minutes, then placed at rest so as to allow the solid part to settle. After confirming that the solid part had settled, the supernatant solution was removed, the remainder was washed with methanol and hydrofluoric acid having a concentration of 20 wt %, then filtered to separate and recover the solid part. Further thereto, a drying process was performed, thereby evaporating and removing the remaining methanol, yielding 10.5 g of a yellow phosphor powder.

In Comparative Example 9, a fluoride phosphor was synthesized in accordance with the method disclosed in Patent Document 2. At ambient temperature, 800 ml of hydrofluoric acid at a concentration of 30 wt % was poured into a fluororesin beaker having a capacity of 1000 ml, and 24 g of potassium permanganate powder (Wako Pure Chemical Industries, reagent grade 1) was dissolved therein. 3.3 g of a single-crystal n-type Si substrate (0.635 mm thick)

having a purity of 6N, crushed to a few cm square, was loaded in this mixed solution, then placed at rest for 48 hours without stirring. A yellow powder that precipitated on the surface of the single-crystal Si substrate was scraped from the substrate with a spatula and recovered. Thereafter, the yellow powder was washed with methanol, the solid part was separated and recovered by filtration, and further thereto, a drying process was performed so as to completely remove the methanol by evaporation, yielding 11.8 g of a yellow phosphor powder. In the resulting powder, the presence of very large particles was observed by the naked eye, so classification was performed using a sieve having a mesh size of 75 μm, yielding 5.8 g of powder that passed through the sieve.

The fluoride phosphors of Comparative Examples 8 and 9 were subjected to X-ray diffraction measurements in the same manner as in Example 7, and it was confirmed that the phosphors were $K_2SiF_6$:Mn in a single phase. Additionally, the phosphor powders were evaluated and monochromatic packages were evaluated in the same manner as Example 7. The evaluation results thereof are shown in Table 7, and the excitation wavelength dependence of the absorption rates are shown in Table 5. The phosphors of Comparative Examples 8 and 9 resulted in lower package luminance and poor reliability compared to the phosphor of Example 7.

TABLE 7

| | Absorption Rate (%) | | IQE(395)/ IQE(455) | Particle Size (μm) | | Mn Content | Monochromatic Package | |
|---|---|---|---|---|---|---|---|---|
| | 300 nm | 520 nm | Ratio (%) | D50 | D90 | (mass %) | Total Luminous Flux | $\Delta x^{1)}$ |
| Comparative Example 8 | 74 | 26 | 41 | 32.3 | 57.5 | 0.53 | 93 | −0.019 |
| Comparative Example 9 | 71 | 32 | 43 | 38.2 | 70.2 | 0.48 | 86 | −0.028 |

1)Shift from initial chromaticity x value after test supplying power for 1000 h at 85° C. and 85% RH Example 15 and Comparative Example 10

In Example 15, the fluoride phosphor of Example 14, and in Comparative Example 10, the fluoride phosphor of Comparative Example 5 were respectively added to a silicone resin together with a β-sialon green phosphor (Denka, GR-MW540K), degassed and kneaded, then potted into surface-mounted packages joined to blue LED elements having a peak wavelength of 450 nm, and thermally cured to produce white LEDs. The ratios between the added amounts of the fluoride phosphors and the β-sialon green phosphors were adjusted so that the chromaticity coordinates (x, y) of the white LEDs, when supplied with power and emitting light, were (0.28, 0.27). The spectrum of the white LED of Example 15 is shown in FIG. 6.

From the resulting white LEDs, ten in which the chromaticity x was within the range 0.275 to 0.285 and the chromaticity y was within the range 0.265 to 0.275 were chosen, the total luminous fluxes when supplied with power and emitting light were measured, and the mean values thereof were calculated. When the mean total luminous flux of the white LED of Comparative Example 10 is defined to be 100%, the mean total luminous flux of the white LED of Example 15 was 108%.

The invention claimed is:

1. A production method for a fluoride phosphor represented by the general formula $A_2SiF_6$:Mn (where element A is an alkali metal element including at least potassium), wherein the fluoride phosphor production method comprises:
   a step of preparing an aqueous solution wherein element A and fluorine are dissolved in a solvent; and
   a step of adding, to the aqueous solution, solid silicon dioxide and a manganese compound that supplies manganese having a valence other than +7; wherein
   an added amount of the manganese compound is within a range such that an Mn content in the fluoride phosphor becomes at least 0.1 mass % and at most 1.5 mass %; and
   the fluoride phosphor precipitates as the silicon dioxide concurrently dissolves into the aqueous solution.

2. The production method as in claim 1, wherein the manganese compound is added simultaneously with the addition of the silicon dioxide.

3. The production method as in claim 1, wherein the manganese compound is added intermittently after the addition of the silicon dioxide so as to maintain the manganese concentration in the aqueous solution.

4. The production method as in claim 1, wherein the manganese compound supplies manganese having a valence of +4.

5. The production method as in claim 1, wherein the manganese compound supplies $MnF_6^{2-}$ complex ions when dissolved in the aqueous solution.

6. The production method as in claim 5, wherein the manganese compound is $K_2MnF_6$.

7. The production method as in claim 1, wherein the silicon dioxide is in powder form.

8. The production method as in claim 7, wherein the silicon dioxide has a specific surface area of 0.1 to 2 $m^2$/g.

9. The production method as in claim 1, wherein the solvent is hydrofluoric acid having a hydrogen fluoride concentration of 40 to 70 mass %.

10. The production method as in claim 1, wherein the aqueous solution contains silicon in a concentration range at which $A_2SiF_6$ crystals do not precipitate.

11. A fluoride phosphor, in powder form, represented by the general formula $A_2SiF_6$:Mn (where element A is an alkali metal element including at least potassium), having a rate of decrease in integrated fluorescence intensity of at most 3% when the phosphor is exposed for 5 minutes to an environmental temperature of 100° C. after being heated for 5 minutes to 300° C., with respect to the integrated fluorescence intensity when the phosphor is exposed for 5 minutes to an environmental temperature of 100° C. prior to being heated to 300° C.

12. A fluoride phosphor, in powder form, represented by the general formula $A_2SiF_6$:Mn (where element A is an alkali metal element including at least potassium), having an absorption rate of at most 50% when irradiated with ultraviolet light having a wavelength of 300 nm, a ratio of at least 78% for internal quantum efficiency at an excitation wavelength of 395 nm with respect to internal quantum efficiency at an excitation wavelength of 455 nm, and an Mn content of at least 0.1 mass % and at most 1.5 mass %.

13. The fluoride phosphor as in claim 12, having an absorption rate of at most 15% when irradiated with green light having a wavelength of 520 nm.

14. The fluoride phosphor as in claim 12, having a volume-based median diameter (D50) of at least 5 μm and at most 35 μm, and a volume-based cumulative 90% diameter (D90) of at least 10 μm and at most 50 μm.

15. A light-emitting device comprising an emission light source and the fluoride phosphor as in claim 12, wherein the emission light source has a peak wavelength of at least 420 nm and at most 480 nm.

16. The light-emitting device as in claim 15, having a rate of decrease of less than 5% in the emission luminance after being left for 1000 hours in an environment having a temperature of 60° C. and a relative humidity of 90%, while being supplied an electric current of 150 mA.

17. The light-emitting device as in claim 15, further comprising a green phosphor having a peak wavelength of at least 510 nm and at most 550 nm when receiving excitation light having a wavelength of 455 nm.

18. The light-emitting device as in claim 17, wherein the green phosphor is Eu-activated β-sialon.

* * * * *